United States Patent
Chen et al.

(10) Patent No.: US 6,401,361 B1
(45) Date of Patent: Jun. 11, 2002

(54) APPARATUS AND METHOD FOR DRYING WAFERS BY A SOLVENT

(75) Inventors: Cho-Ching Chen; Shin-Shing Yang, both of Tainan; Jenn-Wei Ju, Taichung; Liang-Yi Chou, Tainan; Chih-Hong Cheng, Kao Hsiung County, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/713,629

(22) Filed: Nov. 15, 2000

(51) Int. Cl.[7] .............................. F26B 13/10; F26B 21/14
(52) U.S. Cl. .............................. 34/467; 34/524; 34/548; 34/558; 34/570
(58) Field of Search ...................... 34/443, 467, 524, 34/548, 565, 570, 558; 73/40, 168

(56) References Cited

U.S. PATENT DOCUMENTS

| | | | | |
|---|---|---|---|---|
| 4,263,720 A | * | 4/1981 | Bowling | 34/22 |
| 5,762,804 A | * | 6/1998 | Striefler | 210/636 |
| 5,807,439 A | * | 9/1998 | Akatsu | 134/32 |
| 5,826,128 A | * | 10/1998 | Nishada | 396/572 |
| 6,134,807 A | * | 10/2000 | Komino et al. | 34/418 |

* cited by examiner

Primary Examiner—Ira S. Lazarus
Assistant Examiner—K. B. Rinehart
(74) Attorney, Agent, or Firm—Randy W. tung

(57) ABSTRACT

An apparatus for drying semiconductor wafers in a solvent drying chamber and a method for drying are disclosed. The apparatus is equipped with an alarm/interlocking system such that when a flow of the solvent vapor into the drying chamber is stopped, the alarm is triggered and the interlocking system is activated to stop the further loading of wafers into the drying chamber and thus preventing the outputting of undried wafers from the chamber. The apparatus is used to prevent any malfunction in the flow control valves or in any other flow control system that stops the flow of solvent vapor into the drying chamber.

18 Claims, 1 Drawing Sheet

APPARATUS AND METHOD FOR DRYING WAFERS BY A SOLVENT

FIELD OF THE INVENTION

The present invention generally relates to an apparatus and a method for drying semiconductor wafers and more particularly, relates to an apparatus and a method for drying semiconductor wafers by a solvent that has high volatility in a wafer drying apparatus that is equipped with an interlock system for stopping the drying operation when solvent vapor is not detected in the apparatus.

BACKGROUND OF THE INVENTION

In the fabrication of semiconductor devices, a large quantity of deionized (DI) water is frequently used to clean wafers in a wet bench process. For instance, when residual chemical must be removed from the surface of a wafer, DI water rinse is used in the wet bench process to perform major wafer cleaning operations such as quick-dump-rinse and cascade overflow rinse. It is desirable that the surface of the wafer be cleaned by DI water after a chemical or polishing process has been conducted on the wafer, i.e. oxide or nitride deposition, etching or chemical mechanical polishing process. The wet bench wafer cleaning step can be accomplished by equipment that is installed either in-line or in a batch-type process.

A typical automated wafer scrubber combines brush and solution scrubbing by DI water. The scrubber utilizes a hyperbolic high-pressure spray of DI water with a retractable cleaning brush. A typical wafer scrubbing process consists of a DI water spray step followed by a spin dry and nitrogen gas blow dry step. More recently, the solvent drying technology such as the use of isopropyl alcohol (IPA) has been developed to further improve the drying technology.

In a solvent drying technology, such as one that utilizes IPA shown in FIG. 1, the drying process is conducted in a static manner or with the wafer positioned statically without movement. The wafer drying 10 is constructed of a drying tank 12 constructed with a wafer receptacle 14, a chiller 16, a sidewall heater 18 and a bottom heater 20. A cleaned and wet wafer is transported into the drying tank 12, or the vapor chamber. A vapor of IPA is transported into the chamber cavity 22 by a carrier gas such as a high purity nitrogen, or any other high purity inert gas. The vapor enters into cavity 22 is then heated by the bottom heater 20 such that IPA is further vaporized and rises into the cavity 22. The wafer 24 is surrounded by the IPA vapor and, due to the high volatility of IPA, water on the wafer surface can be evaporated away without leaving any water mark, contaminating particles or metal particles. The vapor pressure of IPA can be suitably adjusted such that there is a steady flow of IPA vapor in the cavity 22 fed from the IPA reservoir tank 26.

In the conventional IPA drying tank 10 shown in FIG. 1, the only moving part for transferring wafers into and out of the chamber cavity is a robot arm. There are no other moving parts which can produce contaminating particles. The IPA drying chamber can thus be kept in an extremely clean condition to avoid any contamination of the wafer surface. To further maintain the cleanliness of the chamber cavity 22, an air filter 28 is utilized for filtering incoming air into the cavity 22 and for providing a suitable flow rate of the IPA vapor. After the cleaning process is completed, the water-containing IPA vapor is condensed by the chiller 16 into IPA liquid and is collected at the bottom of the drying chamber 12 for recycling and reuse by the process. The IPA vapor drying process is normally controlled by three major elements, i.e. the purity and the water content of IPA; the flow rate and flow speed of the IPA vapor; and the cleanliness of the IPA vapor.

An improved solvent drying technique has been proposed in recent years which is similar in principal to that described above. In a Marangoni dryer, the drying principal is based on the different surface tension of IPA and DI water. The different surface tension causes the ejection of water molecules from the wafer surface which are then collected by a reservoir in the drying apparatus. The Marangoni drying process is carried out by slowly withdrawing a wafer from a DI water tank immersed in DI water. At the same time, IPA vapor carried by $N_2$ carrier gas is flown onto the wet wafer surface such that IPA is saturated on the exposed wafer surface above the water level. Since the concentration of IPA on the surface of the exposed wafer is larger than the concentration of DI water, the surface tension of IPA is smaller than the surface tension of water in the water tank. This causes the water molecules on the surface of the exposed wafer to be retracted into the water tank and thus achieving the drying purpose.

In the conventional solvent dryer 10 shown in FIG. 1, the IPA vapor is fed from the solvent reservoir tank 26 by conduit 30 through a three-way flow control valve 32 which is pneumatically operated. When the pneumatically controlled three-way flow valve 32 malfunctions such that the flow of IPA vapor through conduit 30 into the tank cavity 22 is stopped, there is no alarm or interlocking function to safeguard such malfunction which can cause serious processing problems since the wafers are no longer dried. It would be highly desirable to provide an alarm or interlocking system to safeguard the three-way flow control valve that feeds IPA vapor into the dryer such that any malfunction of the valve can be detected in time in order to shut-down the drying operation and to stop loading wafers into the drying chamber.

It is therefore an object of the present invention to provide an apparatus for drying wafers that do not have the drawbacks or shortcomings of the conventional wafer drying apparatus.

It is another object of the present invention to provide an apparatus for drying wafers by a high volatility solvent equipped with an alarm and interlocking system for stopping the operation of the drying apparatus when solvent vapor does not flow into the apparatus.

It is a further object of the present invention to provide an apparatus for drying wafers wherein the apparatus is equipped with a three-way flow control valve and an interlocking device for detecting any malfunction of the flow control valve.

It is another further object of the present invention to provide an apparatus for drying wafers utilizing isopropyl alcohol vapor that is equipped with an interlocking device for shutting-down the operation of the drying apparatus when IPA vapor does not flow into the apparatus.

It is still another object of the present invention to provide a method for drying a semiconductor wafer by a solvent wherein a valve opening of a three-way flow control valve for the solvent vapor flow is connected to a vapor pressure sensor and an alarm.

It is yet another object of the present invention to provide a method for drying a semiconductor wafer by a solvent which is capable of detecting a malfunction of a flow control valve which stops the flow of a solvent vapor into the drying chamber.

It is still another further object of the present invention to provide a method for drying a semiconductor wafer by flowing IPA vapor in a $N_2$ carrier gas into the drying chamber and detecting any stoppage of the IPA vapor flow by an alarm and an interlock system.

SUMMARY OF THE INVENTION

In accordance with the present invention, an apparatus and a method for drying semiconductor wafers by a high volatility solvent is provided.

In a preferred embodiment, an apparatus for dying wafers is provided which includes a tank body for storing a quantity of a solvent in a bottom portion and for suspending a wafer in a top portion that is unfilled, the solvent has a volatility not less than the volatility of isopropyl alcohol; a three-way flow control valve; a solvent reservoir for storing a quantity of the solvent; a first conduit providing fluid communication between the top portion of the tank body and a first valve opening in the three-way valve for flowing a solvent vapor into the tank body; a second conduit for transporting a carrier gas to the solvent reservoir tank and for bubbling through the solvent stored therein; a third conduit for providing fluid communication between an air space in the solvent reservoir tank and a second valve opening in the three-way valve; a fourth conduit for providing fluid communication between a third valve opening of the three-way valve and a vapor pressure sensor, the third valve opening and the fourth valve opening are in a normal open position; and an alarm for receiving a signal from the vapor pressure sensor when a solvent vapor is detected.

In the apparatus for drying wafers, the solvent used may be isopropyl alcohol. The vapor pressure sensor utilized may be a diaphragm-type sensor. The second conduit may further include a pneumatically controlled flow control valve. The carrier gas utilized may be an inert gas, such as $N_2$. The solvent reservoir tank used in the apparatus may be a solvent bubbler. The apparatus may further include a fifth conduit for flowing a carrier gas into the first conduit for diluting the solvent vapor and for purging the top portion of the tank body after a drying cycle is completed.

The present invention is further directed to a method for drying a semiconductor wafer by a solvent which can be carried out by the operating steps of first providing a drying tank that has a lower cavity for storing condensed vapor of a solvent and an upper cavity for holding a wafer therein; positioning a wafer in the upper cavity of the drying tank; providing a three-way flow control valve that has a first, a second and a third valve opening; flowing a vapor of a solvent through the first and the second opening of the three-way flow control valve into the upper cavity of the drying tank surrounding the wafer; connecting the third valve opening to a vapor pressure sensor and an alarm; and detecting a vapor of the solvent by the vapor pressure sensor and activating the alarm when a malfunction occurs in the three-way flow control valve stopping the flow of vapor through the first and the second opening of the valve.

The method for drying a semiconductor wafer by a solvent may further include the step of generating the vapor of the solvent in a solvent bubbler, or the step of generating the vapor of the solvent by flowing an inert gas into a volume of solvent stored in a solvent bubbler, or the step of generating the vapor of the solvent from a volume of isopropyl alcohol, or the step of generating the vapor of the solvent by flowing an inert gas of $N_2$ into a volume of isopropyl alcohol stored in the solvent bubbler.

The method for drying a semiconductor wafer by a solvent may further include the step of stopping the loading of wafers into the drying tank after a vapor of the solvent is detected by the vapor pressure sensor. The method may further include the step of providing the three-way flow control valve wherein the first valve opening is in a normal open position to the second valve opening, or the step of providing the three-way flow control valve wherein the second valve opening is in a normal-closed position to the third valve opening. The method may further include the step of flowing a vapor of isopropyl alcohol into the upper cavity of the drying tank, or the step of providing a pneumatically controlled three-way flow control valve.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
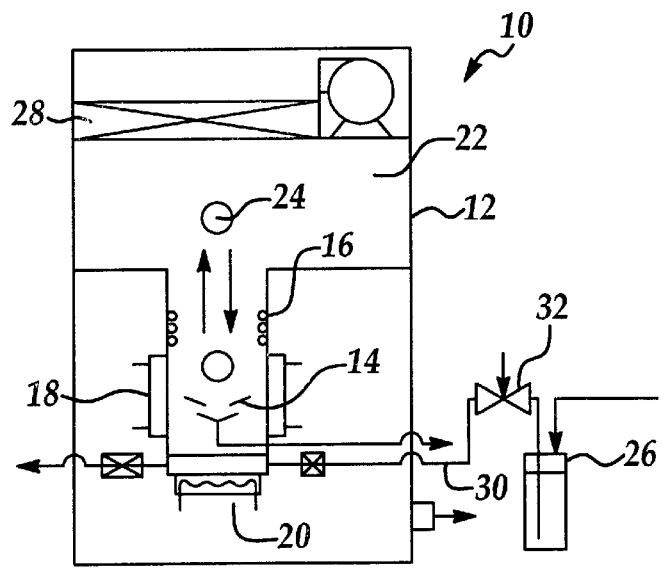
FIG. 1 is a cross-sectional view of a conventional wafer drying apparatus equipped with a solvent bubbler for feeding a solvent vapor into the drying tank.

The present invention discloses an apparatus for drying semiconductor wafers that is equipped with an alarm and an interlocking system for shutting-down the apparatus when a stoppage of flow of a solvent vapor into the drying apparatus is detected. The apparatus can be constructed by a tank body for storing a quantity of a solvent in a bottom portion and for suspending a wafer in a top portion that is not filled by the solvent, the solvent may have a volatility of at least that of isopropyl alcohol; a three-way flow control valve that is pneumatically operated; a solvent reservoir bubbling tank for storing a quantity of the solvent; a number of conduits for providing fluid communication between the drying tank, the solvent bubbler and the alarm/interlocking system; and the alarm/interlocking system for sensing a vapor pressure in a vapor pressure sensor and for triggering the alarm and the interlocking system to stop the loading of wafers into the drying tank when a flow of solvent vapor to the drying tank is stopped. A suitable solvent for use in the present invention wafer drying apparatus may be isopropyl alcohol or any other solvent that has a volatility at least that of isopropyl alcohol. The three-way flow control valve may be pneumatically operated for opening a passageway between the solvent bubbler and the wafer drying tank and for closing the passageway between the bubbling tank and the alarm/interlocking system during normal operation. The wafer drying apparatus may further include a conduit for flowing a carrier gas such as nitrogen into the solvent vapor for diluting the solvent vapor and for purging the wafer drying tank after a drying cycle is completed.

The present invention further discloses a method for drying a semiconductor wafer by a solvent vapor which is capable of detecting a malfunction of the wafer drying process and thus shutting-down the process without producing defective, undried wafers. The method may be carried out by first providing a drying tank that has a lower cavity for storing condensed vapor of a solvent and an upper cavity for holding a wafer therein for drying by the solvent vapor; then positioning a wafer in the upper cavity and flowing a solvent vapor through a three-way flow control valve into the drying tank for drying the wafer surface. When a vapor of the solvent is detected by a vapor pressure sensor connected in fluid communication with a three-way flow control valve thus indicating that a flow of solvent vapor to the drying tank is stopped, the vapor pressure sensor activates an alarm/interlocking system to stop the further loading of wafers into the drying tank and thus preventing the outputting of undried wafers from the tank.

The method may further include the step of generating the solvent vapor by flowing an inert gas such as nitrogen into a volume of high volatility solvent such as isopropyl alcohol that is stored in a solvent bubbler. The method utilizes a three-way flow control valve that is pneumatically operated wherein a passageway between the drying tank and the solvent bubbler is in a normal-open position, while a passageway between the solvent bubbler and the vapor pressure sensor is in a normal-closed position. The method detects a malfunction of the three-way flow control valve when the passageway between the first valve opening and the second valve opening is stopped by detecting a solvent vapor flow through the third valve opening by the vapor pressure sensor for triggering the alarm/interlocking system of the apparatus.

The present invention therefore achieves an important goal of preventing incomplete wafer drying due to malfunction of a three-way flow control valve that is normally operated pneumatically, and thus preventing the outputting from the wafer drying tank of undried wafers and possible scrap of the wafers.

While the present invention apparatus and method includes an alarm/interlocking system that is designed particularly suitable for a Marangoni dryer, it can be equally advantageously used for any other types of solvent drying apparatus for semiconductor wafers. One of the possible malfunctions of the drying apparatus detected by the present invention novel alarm/interlocking system may be caused by the disconnection of a pneumatic pressure source to the three-way flow control valve which disables the valve for feeding the solvent vapor into the drying tank cavity. When such malfunction occurs, incompletely dried wafers are produced from the drying tank which leads to severe quality and reliability problems for IC devices produced from the wafer.

Figure 2:
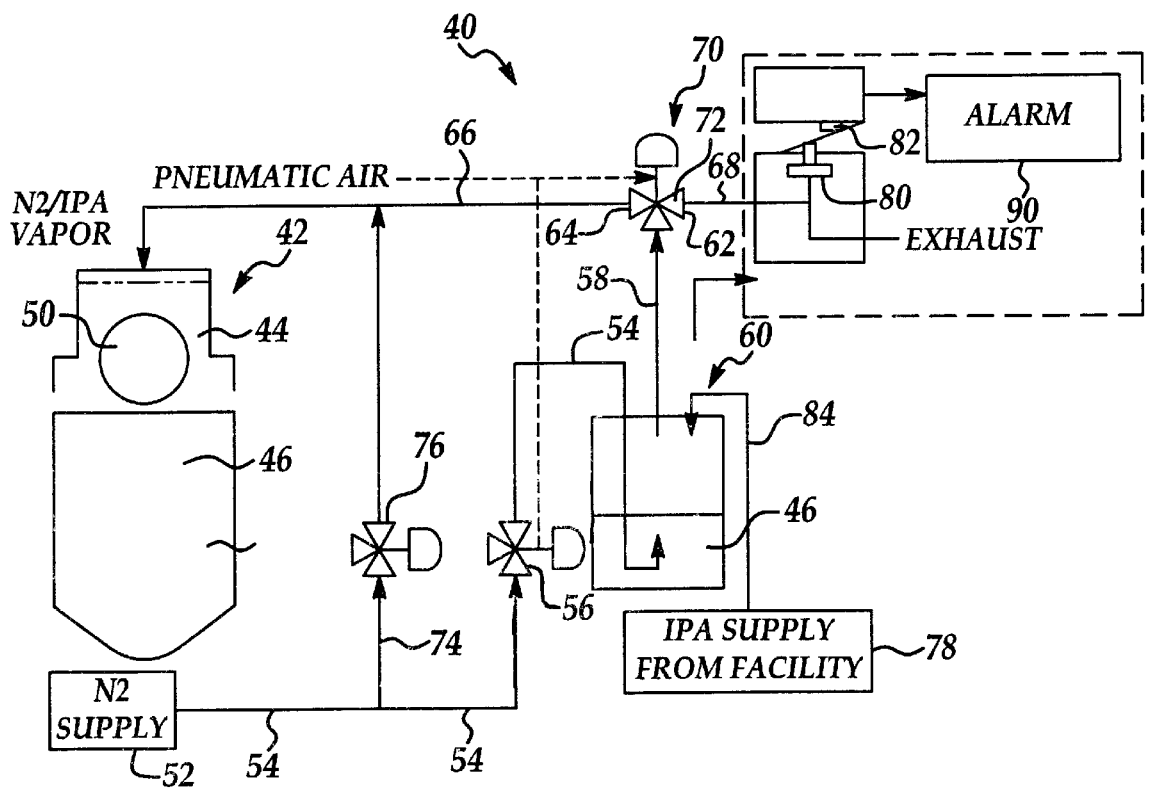
FIG. 2 is a graph illustrating the present invention wafer drying apparatus equipped with an alarm and an interlocking system for shutting-down the drying chamber when the solvent vapor stops flowing into the drying chamber.

A schematic of the present invention wafer drying apparatus equipped with an alarm/interlocking system is shown in FIG. 2. The wafer drying apparatus 40 includes a drying tank 42 having an upper cavity 44 holding a wafer 50 therein, and for holding a volume of condensed vapor, or solvent 46 in a lower cavity 48 of the drying tank 42. A pure inert gas source 52, such as that of $N_2$ gas, is supplied through a second conduit 54 and a flow control valve 56 into a solvent reservoir/bubbler 60. The end of conduit 54 is immersed in a volume of solvent 46 such that it bubbles through the solvent and thus carrying the solvent through conduit 58, a second valve opening 62, a first valve opening 64 of a three-way flow control valve 70 into a first conduit 66. The solvent vapor carried by the inert gas then enters into the upper cavity 44 of the drying tank 42 to perform the wafer drying process.

A fourth conduit 68 is further utilized to connect the third valve opening 72 of the three-way flow control valve 70 to a vapor pressure sensor 80. The vapor pressure sensor 80 may optionally be equipped with a micro-switch 82 for generating a signal when a vapor is detected by the vapor pressure sensor 80. The signal is sent to an alarm/interlocking system 90 for sounding an alarm on a display board in the machine control panel (not shown) and furthermore, for stopping the further loading of wafers into the drying chamber 42. Instead of the micro-switch 82 shown in FIG. 2, the vapor pressure sensor 80 may further be equipped with any other signal-triggering device for activating the alarm/interlocking system 90. The micro-switch 82 is therefore not an absolute necessary part of the present invention alarm/interlocking system 90.

The present invention novel apparatus may further be equipped with a fifth conduit 74 which carries inert gas $N_2$ from the second conduit 54 through a flow control valve 76 into the first conduit 66 and thus diluting the solvent vapor transported in conduit 66. The fifth conduit 74 may further be utilized for feeding nitrogen gas into the drying chamber 42 for purging out the chamber cavity after a wafer drying process has been completed. A solvent supply 78 is further used to feed a solvent, such as IPA through conduit 84 into the solvent reservoir/bubbler 60.

The present invention apparatus and method for drying semiconductor wafers in a solvent drying tank have therefore been amply described in the above description and in the appended drawing of FIG. 2.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for drying a semiconductor wafer by a solvent comprising the steps of:

providing a drying tank having a lower cavity for storing condensed vapor of a solvent and an upper cavity for holding a wafer therein;

positioning a wafer in said upper cavity of said drying tank;

providing a three-way flow control valve having a first, a second and a third valve opening;

flowing a vapor of a solvent through said first and said second opening of said three-way flow control valve into said upper cavity of the drying tank surrounding said wafer;

connecting said third valve opening to a vapor pressure sensor and an alarm; and detecting a vapor of said solvent by said vapor pressure sensor and activating said alarm when a malfunction occurs in said three-way flow control valve where the malfunction stops the flow of vapor through said first and said second openings of said valve.

2. A method for drying a semiconductor wafer by a solvent according to claim 1 further comprising the step of generating said vapor of the solvent in a solvent bubbler.

3. A method for drying a semiconductor wafer by a solvent according to claim 1 further comprising the step of generating said vapor of the solvent by flowing an inert gas into a volume of solvent stored in a solvent bubbler.

4. A method for drying a semiconductor wafer by a solvent according to claim 1 further comprising the step of generating said vapor of the solvent from a volume of isopropyl alcohol.

5. A method for drying a semiconductor wafer by a solvent according to claim 1 further comprising the step of generating said vapor of the solvent by flowing an inert gas of $N_2$ into a volume of isopropyl alcohol (IPA) stored in a solvent bubbler.

6. A method for drying a semiconductor wafer by a solvent according to claim 1 further comprising the step of stopping the loading of wafers into said drying tank after a vapor of said solvent is detected by said vapor pressure sensor.

7. A method for drying a semiconductor wafer by a solvent according to claim 1 further comprising the step of providing said three-way flow control valve wherein said first valve opening is in a normal-open position to said second valve opening.

8. A method for drying a semiconductor wafer by a solvent according to claim 1 further comprising the step of providing said three-way flow control valve wherein said second valve opening is in a normal-closed position to said third valve opening.

9. A method for drying a semiconductor wafer by a solvent according to claim 1 further comprising the step of flowing a vapor of isopropyl alcohol into said-upper cavity of the drying tank.

10. A method for drying a semiconductor wafer by a solvent according to claim 1 further comprising the step of the step of providing a pneumatically-controlled three-way flow control valve.

11. An apparatus for drying wafers comprising:

a tank body for storing a quantity of a solvent in a bottom portion and for suspending a wafer in a top portion that is unfilled, said solvent having a volatility not less than the volatility of isopropyl alcohol;

a three-way flow control valve;

a solvent reservoir tank for storing a quantity of said solvent;

a first conduit providing fluid communication between said top portion of said tank body and a first valve opening in said three-way valve for flowing a solvent vapor into said tank body;

a second conduit for transporting a carrier gas to said solvent reservoir tank and for bubbling through said solvent stored therein;

a third conduit for providing fluid communication between an air space in said solvent reservoir tank and a second valve opening in said three-way valve;

a fourth conduit for providing fluid communication between a third valve opening of said three-way valve and a vapor pressure sensor, said third valve opening is in a normal closed position to said second valve opening; and when the third valve opening is open due to a malfunction in said first valve opening, a solvent vapor enters the third valve opening, and then a vapor pressure sensor detects the solvent vapor and activates an alarm.

12. An apparatus for drying wafers according to claim 11, wherein said solvent used is isopropyl alcohol (IPA).

13. An apparatus for drying wafers according to claim 11, wherein said vapor pressure sensor is a diaphragm-type sensor.

14. An apparatus for drying wafers according to claim 11, wherein said second conduit further comprises a pneumatic flow control valve.

15. An apparatus for drying wafers according to claim 11, wherein said carrier gas used is an inert gas.

16. An apparatus for drying wafers according to claim 11, wherein said carrier gas used is $N_2$.

17. An apparatus for drying wafers according to claim 11, wherein said solvent reservoir tank is a solvent bubbler.

18. An apparatus for drying wafers according to claim 11 further comprising a fifth conduit for flowing a carrier gas into said first conduit for diluting said solvent vapor and for purging said top portion of the tank body after a drying cycle is completed.

* * * * *